OSCILLATOR WITH INDUCTIVELY COUPLED NEGATIVE AND POSITIVE FEEDBACK
Filed March 5, 1962
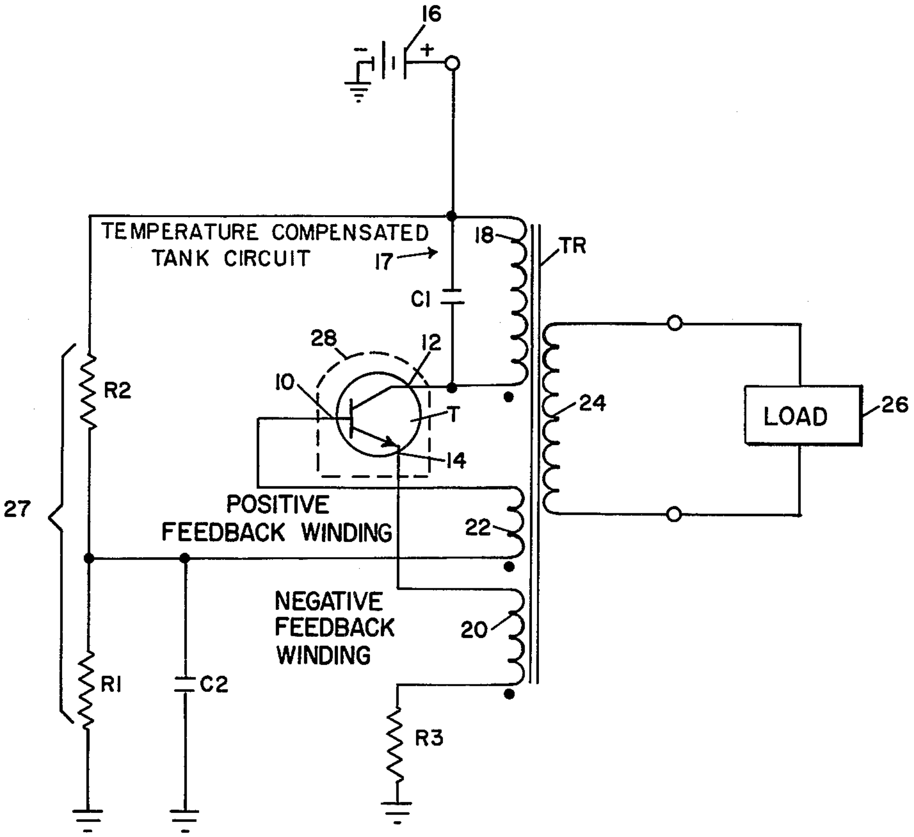
Joseph E. Racy
Alan F. Hurley
*INVENTORS*

United States Patent Office 3,218,574
Patented Nov. 16, 1965

3,218,574

OSCILLATOR WITH INDUCTIVELY COUPLED NEGATIVE AND POSITIVE FEEDBACK

Joseph E. Racy and Alan F. Hurley, Nashua, N.H., assignors to Sanders Associates, Inc., Nashua, N.H., a corporation of Delaware Filed Mar. 5, 1962, Ser. No. 177,682
2 Claims. (Cl. 331—109)

This invention relates to an improved electronic oscillator that combines, in a novel manner, positive and negative feedback to provide a highly stable output signal. The oscillator, which comprises only a single active element, is particularly suited for operation at audio frequencies and it provides an output which is essentially free of harmonic content.

According to the prior art, complex multi-stage oscillators constructed with a multitude of components are generally required to produce a signal having stable frequency and amplitude characteristics. Low-cost, single-stage oscillators designed to provide stable, distortion-free waveforms have not been commercially successful.

Accordingly, it is a principal object of the present invention to provide an improved electronic oscillator having a stable output signal during prolonged operation.

A further object of the invention is to provide an improved oscillator that produces an output signal which is substantially free of harmonic content and whose frequency and amplitude characteristics remain substantially constant in spite of variations in the ambient temperature.

Still another object of the invention is to provide an electronic oscillator whose output signal characteristics are substantially independent of fluctuations in the power supply voltage and transistor characteristics.

Yet another object is to provide an improved audio oscillator whose operation is substantially unaffected by variations in the load impedance connected to it.

A still further object is to provide an oscillator of the above description that is simply constructed with a minimum number of components.

Yet another object of the invention is to provide a low cost audio oscillator of the above description having a minimum space requirement.

The invention accordingly comprises the features of construction, combination of elements, and arrangement of parts which will be exemplified in the construction hereinafter set forth, and the scope of the invention will be indicated in the claims.

For a fuller understanding of the nature and objects of the invention, reference should be had to the following detailed description taken in connection with the accompanying drawing which is a schematic representation of an oscillator embodying the invention.

The present oscillator comprises a single active element, preferably a transistor, connected to energize a resonant tank circuit. Positive feedback from the tank circuit to the input of the element causes the circuit to oscillate at the resonant frequency of the tank circuit. The waveform and stability of the oscillations are enhanced by providing negative feedback from the tank circuit to regulate the operation of the active element.

In accordance with well-known techniques the components of the tank circuit are preferably constructed with materials whose electrical characteristics change in opposite directions as a function of temperature. With this construction, the resonant frequency of the tank circuit is substantially invariant with temperature and, accordingly, the oscillator operation remains stable in spite of changes in the ambient temperature. Moreover, the transistor may be enclosed in an oven to maintain its temperature constant, thereby further enhancing the temperature stability of the oscillator.

As shown in the drawing, the oscillator comprises a transistor T, having a base electrode 10, a collector electrode 12, and an emitter electrode 14, all connected to a multiple-winding transformer TR. A tank circuit 17, comprising the parallel combination of a capacitor C1 and a transformer primary winding 18, is connected between the collector electrode 12 and a power supply, shown as a battery 16.

A negative feedback winding 20 on the transformer TR is connected in series with a resistor R3 between the emitter electrode 14 and a common or ground terminal. A positive feedback winding 22 is connected in series with the parallel combination of a capacitor C2 and a resistor R1 between the base electrode 10 and ground. A transformer output winding 24 couples the output power to a load indicated at 26. The transformer windings 18, 20 and 22 are labeled with dots according to conventional notation to indicate the relative polarities of the voltages across them.

The transistor T is biased to operate in the linear region of its operating characteristics by establishing, through a voltage divider 27 comprising resistors R1 and R2, a positive voltage at the base electrode 10 with respect to the emitter electrode 14. The operating point is also a function of the resistance of resistor R3. The capacitor C2 provides an A.C. shunt around the resistor R1.

Still referring to the drawing, assume that the collector current in the transistor is increasing. The voltage at the dotted end of the winding 18 becomes increasingly negative with respect to the other end of this winding. The corresponding change in the voltage across the winding 22 is such as to increase base-emitter current in the transistor and this results in a further increase in collector current. This regenerative feedback is sufficient to sustain oscillations whose frequency is determined largely by the resonant frequency of the circuit 17.

As is well known, the amplitude of oscillations of a purely regenerative circuit will generally build up until the transistor cuts off during part of each cycle, with rectification taking place in the base-emitter circuit. This results in a highly distorted waveform having a large harmonic content. Moreover, operation is then materially dependent on such factors as supply voltage and transistor characteristics, and variations in these factors result in significant frequency excursions. These deficiencies are overcome by the negative feedback from the winding 20, aided by a certain amount of negative feedback due to the resistor R3.

More specifically, the voltage across the winding 20 has the opposite effect to that of the winding 22. Therefore, it tends to reduce the amplitude of oscillation and limit operation to the more nearly linear portions of the transistor characteristics. In common with the degenerative feedback conventionally used in amplifiers, it also linearizes operation and makes the performance of the circuit relatively independent of power supply voltage and transistor characteristics. Thus, by selecting the proper ratio of negative feedback via winding 20, to positive feedback via winding 22, stable oscillation is obtained with a waveform exhibiting essentially only the fundamental component. For the oscillator of FIG. 1, this ratio is 60:170.

The oscillator is preferably constructed with the core of transformer TR of a material whose magnetic characteristics vary with temperature inversely with respect to the changes in the electrical characteristics of the dielectric material in the capacitor C1. For example, the transformer core may be of a molybdenum-iron alloy, commercially available as molybdenum-permalloy, and capacitor C1 may be constructed with a dielectric of polytetrafluoroethylene, commercially available as Teflon. With this construtcion, the resonant frequency of the tank circuit 17 is substantially invariant with temperature. Further temperature stability may be obtained by enclosing the circuit in an oven, indicated schematically at 28, to maintain the coefficients of transistor operation substantially constant with changes in ambient temperature.

An indication of the stability of the simple circuit described herein is provided by tests which demonstrate that the frequency of oscillation deviates by less than one cycle per second from a selected operating frequency of 400 cycles per second, i.e., less than 0.25%, when the voltage of the battery 16 varies by as much as 10%.

By way of example, the oscillator may be constructed with the following component values for use as a reference source for a frequency controlled inverter operating at 400 cycles per second:

| | |
|---|---|
| Transistor T | 2N 1566. |
| Capacitor C1 | Between 0.15 and 0.2 microfarads, selected to resonate with winding **18** at 400 cps. |
| Capacitor C2 | 4 microfarads. |
| Resistor R1 | 75,000 ohms. |
| Resistor R2 | 5,000 ohms. |
| Resistor R3 | 422 ohms. |
| Battery **16** | 20 volts. |
| Winding **18** | 800 millihenries, 3000 turns. |
| Winding **20** | 60 turns. |
| Winding **22** | 170 turns. |
| Winding **24** | 90 turns. |
| Impedance of load **26** | 50–60 ohms. |

In summary, the improved single stage oscillator described herein provides a substantially undistorted sine wave output signal having a selected frequency. The waveform, frequency and amplitude all remain stable during prolonged operation, notwithstanding significant changes in transistor characteristics and changes in the supply voltage.

Such performance, heretofore provided only by relatively complex multi-stage circuits, is obtained with a single transistor in a simple circuit arrangement which uses a four-winding transformer to provide both positive and negative feedback in the proper ratio. In addition, the circuit maintains the output voltage substantially uniform over a fairly wide range of load impedances.

It will thus be seen that the objects set forth above, among those made apparent from the preceding description, are efficiently attained and, since certain changes may be made in the above construction without departing from the scope of the invention, it is intended that all matter contained in the above description shall be interpreted as illustrative and not in a limiting sense.

Having described our invention, what we claim as new and desire to secure by Letters Patent is:

1. An audio oscillator comprising, in combination, (a) a transistor having a base electrode, a collector electrode and an emitter electrode, (b) a transformer having first, second, third and fourth windings, (c) a first capacitor connected in parallel with said first winding to form a tank circuit resonant at a selected audio frequency, (d) a direct current source having (1) a first output terminal connected with a common terminal and (2) a second output terminal, (e) said tank circuit being connected between said second terminal and said collector electrode, (f) voltage divider comprising the series combination of first and second resistors and connected in series between said first and second terminals, (g) said second winding being in series between said base electrode and the junction of said first and second resistors, (h) a third resistor, (i) said third winding being in series with said third resistor between said emitter and said first terminal, (j) said first and second windings being magnetically coupled to provide positive feedback from said tank circuit to said base electrode to produce oscillations at said selected frequency, (k) said first and third windings being magnetically coupled to provide negative feedback between said tank circuit and said emitter electrode to stabilize said oscillations, (l) said first and fourth windings being magnetically coupled to deliver said oscillations to a load connected to said fourth winding, (m) a by-pass capacitor connected in parallel with said second resistor, (n) said transformer being constructed with a core of material whose electrical characteristics vary with temperautre substantially inversely with respect to the variation of the electrical characteristics of the dielectric material of said first capacitor, (o) whereby the resonant frequency of said tank circuit remains substantially constant when the temperature thereof varies.

2. The combination defined in claim 1 further comprising means for maintaining said transistor at a substantially uniform temperature, thereby enhancing the stability of said oscillator with respect to variations in ambient temperature.

References Cited by the Examiner

UNITED STATES PATENTS

| | | | |
|---|---|---|---|
| 2,027,521 | 1/1936 | Drake | 331—176 |
| 2,983,879 | 5/1961 | Dodge | 331—109 X |
| 3,042,870 | 7/1962 | Minner et al. | 331—109 X |

FOREIGN PATENTS

| | | |
|---|---|---|
| 876,042 | 8/1961 | Great Britain. |

ROY LAKE, *Primary Examiner.*

JOHN KOMINSKI, *Examiner.*